United States Patent [19]

Murakami et al.

[11] Patent Number: 4,645,690

[45] Date of Patent: Feb. 24, 1987

[54] METHOD OF MANUFACTURING A MAGNETIC MEDIA

[75] Inventors: Shiro Murakami; Shigeo Fujii; Masayuki Nakao; Yoshio Igarashi; Juro Endo, all of Kumagaya, Japan

[73] Assignee: Hitachi Metals, Ltd., Tokyo, Japan

[21] Appl. No.: 697,405

[22] Filed: Feb. 1, 1985

[30] Foreign Application Priority Data

Feb. 2, 1984 [JP] Japan ................................. 59-17449
May 22, 1984 [JP] Japan ............................... 59-103500

[51] Int. Cl.$^4$ .............................................. G11B 5/84
[52] U.S. Cl. ................................... 427/128; 427/129; 427/130; 428/694; 428/900
[58] Field of Search ................ 428/694, 900; 427/130, 427/128, 129

[56] References Cited

U.S. PATENT DOCUMENTS

| | | | |
|---|---|---|---|
| 4,277,540 | 7/1981 | Aine | 428/900 |
| 4,326,229 | 4/1982 | Yanagisawa | 428/900 |
| 4,362,767 | 12/1982 | Nouchi et al. | 428/900 |
| 4,385,098 | 5/1983 | Sugita et al. | |
| 4,387,136 | 6/1983 | Saito et al. | |
| 4,411,953 | 10/1983 | Miyoshi et al. | 428/900 |
| 4,450,186 | 5/1984 | Shinohara | |
| 4,507,364 | 3/1985 | Kadokura et al. | 428/900 |
| 4,520,070 | 5/1985 | Yamamoto et al. | 428/900 |
| 4,521,481 | 6/1985 | Nagao et al. | 428/900 |
| 4,522,844 | 6/1985 | Khanna et al. | 427/38 |
| 4,536,443 | 8/1985 | Nagao et al. | 427/132 |

OTHER PUBLICATIONS

H. Maeda, "Effect of Nitrogen on High Coercivity and Microstructure of Co-Ni alloy Films," J. Appl. Phys., vol. 53, No. 10, Oct. 1982, pp. 6941–6945.

H. Maeda, "High Coercivity Co and Co-Ni Alloy Films," J. Appl. Phys., vol. 53, No. 5, May 1982, pp. 3735–3739.

Japanese Laid Open Patent Publication No. 57-72307 and in English Language Translation thereof.

*Primary Examiner*—George F. Lesmes
*Assistant Examiner*—William M. Atkinson
*Attorney, Agent, or Firm*—Finnegan, Henderson, Farabow, Garrett & Dunner

[57] ABSTRACT

A manufacturing process of Co-Ni magnetic recording media by sputtering Co-Ni thin film layer on a substrate in Argon atmosphere including oxygen or air and heating the thin film to evaporate oxygen or air from the layer to prepare the magnetic recording media appropriate for high density longitudinal recording, wherein on sputtering the substrate is maintained at a temperature of room temperature to 300° C.

4 Claims, No Drawings

METHOD OF MANUFACTURING A MAGNETIC MEDIA

DETAILED DESCRIPTION OF THE INVENTION

1. Field of the Invention

This invention relates to magnetic recording media, especially a rigid magnetic recording disk which is used for a longitudinal, that is in-plane, recording.

2. BACKGROUND OF THE INVENTION

As magnetic recording media on a rigid disk, there have been used γ-hematite, Co-Pt, Co-Ni-Pt, and Co-Ni-P. The hematite media are coated with a resin on an aluminum or aluminum alloy substrate in a thin layer. The hematite media have been used for a long time in a lot of applications. But recently, strong demand for high recording density disk has occurred but the coated hematite media can not clear the demand. Instead of the coated hematite media, thin film media have been proposed for high recording density. The thin film media include plated media and sputtered media. The plated media, e.g. Co-Ni-P, have a disadvantage such as corrosion due to residual chemicals. Also, the corrosion causes an error of reading written data so that a very high density of recording cannot be accomplished. Consequently, plated thin film media for longitudinal recording have inherently high defect densities and poor corrosion resistance.

By contrast, sputtered thin film media have been expected to have a superior quality in every respect including: electrical characteristics, flyability, durability, wear, adhesion, defect density, corrosion resistance and reproducibility. As the sputtered thin film media, cobalt base alloys, e.g. Co-Ni-Pt, Co-Ni, have been proposed to be adopted for magnetic recording media for high longitudinal recording density. The Co-Ni-Pt is rather expensive because it contains platinum of about 10 at % which is an expensive element.

On the other hand, directly sputtered Co-Ni film tends to have its C-axes perpendicular to the sputtered plane so it is not appropriate to longitudinal recording.

For longitudinal recording media, magnetic recording media of sputtered thin film were proposed in some articles. According to Dr. H. Maeda, J. Appl. Phys. 53 (5) May 1982 p.3735 "High coercivity Co and Co-Ni alloy films" and J. Appl. Phys. 53 (10) October 1982 p.6941 "Effect of nitrogen on the high coercivity and microstructures of Co-Ni alloy films" and his patent application, Japanese laid-open patent No. 57-72307, cobalt metal or Co-Ni-alloy is sputtered in an atmosphere including nitrogen to form a thin film including nitrogen and then the thin film is heat-treated in vacuum or inert gas atmosphere to make it thin film magnetic recording media with good magnetic properties. Those papers teach that the sputtering process is required to be done on a substrate which is cooled by liquid nitrogen to obtain a sufficient nitrogen content in the sputtered thin film.

Like Dr. Maeda's experiment, when a glass plate or a quartz plate is used as the substrate, it is no problem to cool the substrate to liquid nitrogen temperature. The sputtering surface of the substrate is cooled to the temperature to make it easy to capture nitrogen in the sputtered film even though ion bombarding by sputtering causes to increase the temperature of the sputtering surface.

However, when an anodized aluminum plate is used as a substrate, the anodized layer is cooled to liquid nitrogen temperature on its one side which adheres to aluminum substrate and is heated on the other side by ion bombarding so the sputtered surface of the anodized layer is heated to a temperature above room temperature. The temperature difference between both the sides of anodized layer on aluminum substrate reaches to 100° C. or more. Since the anodized layer has poor heat conductivity, this temperature difference results in cracks in the layer or peeling of the layer.

Further, the cooling of the substrate by liquid nitrogen causes high cost to manufacture a disk not only by precious liquid nitrogen consumption but also by requirement of complicated equipment and by impossibility of simultaneous sputtering of the two sides of the substrate.

BRIEF DESCRIPTION OF THE INVENTION

An object of the invention is to provide a process of manufacturing sputtered magnetic recording media having excellent magnetic properties.

Another object of the invention is to provide longitudinal magnetic recording media which is manufactured by sputtering on a substrate of a temperature or room temperature or more.

This invention has been made on the basis that the inventors found that longitudinal magnetic recording media having excellent magnetic properties can be manufactured by sputtering in atmosphere including oxygen or air.

According to this invention, the objects are accomplished by a process comprising the steps of: sputtering with an alloy target on a non-magnetic substrate in atmosphere of inert gas including oxygen or air, the non-magnetic substrate being maintained at a temperature of room temperature to 300° C. and the alloy target having approximately the same composition as the composition of the final product, to obtain on the substrate a thin film including oxygen or air, and heating the thin film to evaporate the oxygen or air which has been absorbed in the thin film in the sputtering process and to form magnetic recording media which have a composition of Ni less than 35 atomic % and the balance substantially being Co and substantially a hexagonal close packed crystalline structure which C-axes are mainly in a recording media plane. This invention has a special advantage that the magnetic recording media are secured even to an anodized aluminum alloy substrate.

The thickness of the sputtered media is preferably 400 to 1000 angstroms. The substrate temperature is allowed to be from room temperature to 300° C., preferably to 100° C. from the point of productivity and ease of oxygen or air absorption.

The heat-treatment after sputtering is accomplished at a temperature at which the oxygen or air that has been absorbed in the sputtered film is evaporated from the film. The preferred temperature is 310° C. to 500° C.

DETAILED DESCRIPTION OF THE EMBODIMENTS

According to this invention, first a sputtered thin film including oxygen or air of an appropriate content is prepared during sputtering process to make Co-Ni-O(N) layer of amorphous structure or fine crystalline structure of grain size of about 50 to about 250 angstroms or mixture of such microcrystals and amorphous state. Then by crystallization and/or grain growth through heating, C-axes of hexagonal Co-Ni crystals are mainly oriented in the film plane.

According to this invention, amorphous-like or microcrystalline Co-Ni-O(N) layer including oxygen or air of 10 to some tens atomic % can be formed without special cooling of a substrate at sputtering deposition rate of 25 Å/min. to 170 Å/min., even at high deposition rate of 300 Å/min. to 2,000 Å/min. Heat-treatment after the sputtering results in magnetic recording media showing considerably better properties than the prior art. When the substrate was heated to more than 300° C. on the sputtering, the oxygen or air content in the sputtered layer was decreased so that coercivity after heat treatment was decreased and a magnetic thin film appropriate for high density magnetic recording was not obtained. When the substrate temperature is from room temperature to 100° C., oxygen or air is easily captured in the sputtered layer.

The composition of the media is not limited to cobalt metal and cobalt-nickel alloy, but Pt, Ru, Rh, Os, Ir, Re, Cr, Ti, Mo and/or W of less than about 10 atomic % can be added to cobalt or cobalt nickel alloy. These additives may improve corrosion resistance.

This invention will be explained by examples below.

The examples were carried out by magnetron sputtering but it is apparent from ion technologies that the similar results can be obtained by ion beam sputtering.

EXAMPLE I

By planar magnetron sputtering process, thin film layers were formed on anodized aluminum alloy substrates (3.9 wt % Mg-bal. Al) by the following conditions.

| Initial evacuation | $1-2 \times 10^{-6}$ Torr |
|---|---|
| Total atm. pressure | 20 m Torr |
| Oxygen content | 30 vol. % in Argon |
| Electric power | 1 KW |
| Target diameter | 120 mm |
| Distance between cathod and substrate | 120 mm |
| Film thickness | 800–1000 Å |

As a target, cobalt metal and Co-Ni alloy plates were used. Substrate temperature was controlled by an electric heater positioned in a substrate holder and measured by a thermocouple on the back of the substrate. Deposition rate of the thin film was adjusted by sealing the substrate. Oxygen contents in the sputtered layer were determined by Auger electron microscope analysis.

From X-ray diffraction of the sputtered layers, it was recognized that all samples except the one of 350° C. substrate temperature exhibited halo pattern diffraction spectra, that is, amorphous or microcrystalline material's spectra, and some unknown spectra.

After 1 hour heat treatment at 400° C. in vacuum, the thin films were measured with magnetic properties in a direction parallel to the film surface by vibrating sample magnetometer.

The experimental data are shown in Table 1 in which squareness S means a ratio of residual induction Br to magnetic flux density B at 3 KOe magnetic field strength.

Oxygen content of all the films was less than 5 atomic % after 1 hour heat treatment at 400° C. in vacuum. It was recognized that all of the films belonged to h.c.p. crystal except the sample of 350° C. substrate temperature by X-ray diffraction and that C-axes are strongly oriented in the media plane.

When nickel content of the thin film composition exceeded 40 atomic %, f.c.c. phase appeared along with h.c.p. and the film was not appropriate for magnetic recording media because both squareness and coercivity were too low.

TABLE 1

| Target composition (at %) | Sputtering condition | | Oxygen content before heating (at %) | Magnetic properties | | |
|---|---|---|---|---|---|---|
| | Substrate temperature (°C.) | Deposition rate (Å/min) | | Coercive force Hc(Oe) | Residual induction Br(KG) | Squareness S(Br/B3k) |
| Metallic Co | R.T. | 300 | 41 | 400 | 11.4 | 0.76 |
| | 100 | 300 | 43 | 400 | 11.2 | 0.75 |
| | 200 | 200 | 47 | 450 | 11.0 | 0.74 |
| | 300 | 200 | 34 | 400 | 10.2 | 0.70 |
| | 350 | 200 | 14 | 200 | 7.7 | 0.51 |
| Co—15 Ni | R.T. | 300 | 42 | 950 | 10.5 | 0.79 |
| | 100 | 300 | 45 | 1,000 | 11.4 | 0.83 |
| | 200 | 300 | 44 | 800 | 10.7 | 0.77 |
| | 300 | 200 | 32 | 650 | 10.8 | 0.76 |
| | 350 | 200 | 16 | 250 | 9.3 | 0.67 |
| Co—25 Ni | R.T. | 300 | 39 | 1,000 | 11.1 | 0.84 |
| | 100 | 300 | 41 | 1,050 | 10.5 | 0.85 |
| | 200 | 300 | 43 | 900 | 10.2 | 0.82 |
| | 300 | 200 | 35 | 750 | 9.9 | 0.81 |
| | 350 | 200 | 17 | 300 | 7.4 | 0.62 |
| Co—35 Ni | R.T. | 200 | 40 | 800 | 10.2 | 0.76 |
| | 100 | 200 | 42 | 800 | 10.0 | 0.75 |
| | 200 | 200 | 42 | 750 | 9.7 | 0.73 |
| | 300 | 200 | 30 | 450 | 9.3 | 0.72 |
| | 350 | 200 | 16 | 200 | 6.4 | 0.53 |

From the above experiments it is apparent that the media which were made on the substrate of less than 300° C. showed enough squareness and are appropriate for magnetic recording media. Especially, the film made on a substrate of room temperature to 100° C. showed high coercivity and suitable for high density magnetic recording. The films of Co-15% Ni and Co-25% Ni showed squareness and residual induction which are superior to the squareness of 0.75 and the magnetic flux density of 8000 G in prior art.

Magnetization of a film after heat treatment of 300° C. × 1 hour is only 20 to 30% of one after heat treatment of 400° C. × 1 hour. By another experiment it was found that magnetic properties of the media which were formed on an anodized aluminum alloy substrate and heat-treated at 310° C. for an hour were approximately on the same level as that obtained with the media after 500° C.×1 hour heat treatment. 310° C.×1 hour heat treatment is enough to obtain excellent magnetic properties.

Heat treatment at a temperature of above 500° C. may be applied, but when an anodized aluminum alloy substrate is used, such a high temperature heat treatment deforms the aluminum substrate and causes crack in the film or peeling-off the film. So, it is preferable that the heat treatment is done at a temperature between 310° C. and 500° C.

EXAMPLE II

By the same sputtering conditions as described in EXAMPLE I except for the following, thin film layers were prepared on anodized aluminum alloy substrate with anodized layer of about 13 μm thick.

| | |
|---|---|
| Total atm. pressure | 40 m Torr |
| Oxygen content | 45 vol. % in Argon |
| Electric power | 1-2.5 KW |
| Electrode distance | 80 mm |
| Film thickness | 400-600 Å |

As a result of increasing oxygen content in the sputtering atmosphere, the oxygen content in the sputtered layers in this EXAMPLE were rather large than those in EXAMPLE 1. But, during heat treatment at 320° to 400° C. for 1 hour almost all of oxygen in the layer was evaporated and the oxygen in the film after the heat treatment was less than 5 at %, that is, most samples contained only about 1% oxygen.

Magnetic properties measured with different substrate temperatures are shown in Table 2. From the table, it is apparent that oxygen content in sputtered layers depends on substrate temperature and the lower substrate temperature effects the higher oxygen content. Even high deposition rate, e.g. 800 Å/min. and 2000 Å/min. did not affect magnetic properties.

liquid nitrogen but is maintained at a temperature of room temperature to 300° C., preferably to 100° C., considerably better magnetic properties were obtained than those obtained on a liquid nitrogen cooled substrate. Since this invention does not use liquid nitrogen, thin film forming is easy and causes big economic effect because of possibility of the simultaneous sputtering of both side of the disk and simple equipment for sputtering and no consumption of precious liquid nitrogen.

What is claimed is:

1. A process for manufacturing magnetic recording media comprising the steps of:
   sputtering a metal alloy comprised of nickel and cobalt as a thin film onto a non-magnetic substrate consisting essentially of an anodized aluminum alloy in an inert gas containing oxygen, said substrate being maintained at a temperature of from about room temperature to 300° C. during said sputtering step thereby forming an oxygen containing metal thin film comprised of oxygen and said metal alloy on said anodized aluminum alloy substrate; and
   heating said oxygen containing thin film and said substrate to evaporate the oxygen absorbed in said thin film during the sputtering step thereby forming a magnetic recording media with a metal alloy thin film on said substrate, said metal alloy thin film having a composition of less than 35 atomic % nickel with the balance being substantially cobalt, said metal alloy thin film having a hexagonal close-packed crystalline structure wherein the C-axes of the cobalt-nickel crystals forming said structure are in the plane of said recording media.

2. The process of claim 1 wherein said heating step reduces the amount of oxygen in said metal alloy thin film to about 1 atomic %.

3. The process as set forth in claim 1, wherein the thin film is 400 to 1,000 Å thick.

4. The process as set forth in claim 1, wherein the non-magnetic substrate is maintained at a temperature of room temperature to 100° C.

TABLE 2

| Target composition (at %) | Sputtering condition | | Oxygen content before heating (at %) | Magnetic properties | | |
|---|---|---|---|---|---|---|
| | Substrate temperature (°C.) | Deposition rate (Å/min) | | Coercive force Hc(Oe) | Residual induction Br(KG) | Squareness S(Br/B3k) |
| Co—15 Ni | R.T. | 800 | 44 | 1,000 | 10.3 | 0.78 |
| | 100 | 800 | 44 | 950 | 10.7 | 0.80 |
| | 200 | 800 | 43 | 950 | 10.8 | 0.81 |
| | 300 | 800 | 33 | 800 | 10.3 | 0.77 |
| | 350 | 800 | 20 | 450 | 9.0 | 0.65 |
| Co—20 Ni | R.T. | 50 | 60 | 950 | 10.4 | 0.80 |
| | 100 | 100 | 55 | 850 | 10.3 | 0.81 |
| Co—25 Ni | R.T. | 2,000 | 34 | 900 | 10.7 | 0.81 |
| | 100 | 2,000 | 33 | 800 | 10.5 | 0.80 |
| | 300 | 2,000 | 27 | 750 | 10.8 | 0.82 |
| | R.T. | 400 | 48 | 1,000 | 10.4 | 0.82 |
| | 100 | 400 | 49 | 1,000 | 10.2 | 0.81 |
| | 300 | 400 | 42 | 900 | 10.5 | 0.83 |

As apparent from the above examples, by sputtering on a non-magnetic substrate which is not cooled by

* * * * *